United States Patent
Galambos et al.

(10) Patent No.: US 6,570,522 B1
(45) Date of Patent: May 27, 2003

(54) DIFFERENTIAL INTERPOLATED ANALOG TO DIGITAL CONVERTER

(75) Inventors: Tibi Galambos, Binyamina (IL); Viktor Ariel, Tel Aviv (IL); Jungwook Yang, West Nyack, NY (US); Eliyahu Shamsaev, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/042,190

(22) Filed: Jan. 11, 2002

(51) Int. Cl.[7] .............................................. H03M 1/12
(52) U.S. Cl. ....................................................... 341/155
(58) Field of Search .................................. 341/155, 159, 341/143

(56) References Cited

U.S. PATENT DOCUMENTS 6,014,098 A    1/2000  Bult et al.
6,285,308 B1 *  9/2001  Thies .......................... 341/155

OTHER PUBLICATIONS

"A 10–b 300 MHz Interpolated Parallel A/D Converter", by Kimura et al., in IEEE Journal of Solid–State Circuits, vol. 28, No. 4, Apr. 1993, pp. 438–446.

"A 10–b 50 MS/s 500 mW A/D Converter Using a Differential–Voltage Subconverter", by Miki et al., in IEEE Journal of Solid–State Circuits vol. 29, No. 4, Apr. 1994, pp. 516–522.

"Error Suppressing Encode Logic of FCDL in 6–b Flash A/D Converter", by Ono et al., in IEEE Journal of Solid–State Circuits vol. 32, No. 9, Sep. 1997, pp. 1460–1464.

* cited by examiner

Primary Examiner—Brian Young
(74) Attorney, Agent, or Firm—Browdy and Neimark

(57) ABSTRACT

An analog-to-digital converter (ADC), including a plurality of first-level folded-differential-logic-encoders (FDLEs), coupled to receive an analog input signal and respective reference voltages and to provide respective outputs responsive to comparing a magnitude of the input signal to the respective reference voltages. The ADC has a second-level resultant FDLE, which is coupled to receive and combine the outputs of the first-level FDLEs to provide a digital value indicative of the magnitude of the input signal.

20 Claims, 8 Drawing Sheets

DIFFERENTIAL INTERPOLATED ANALOG TO DIGITAL CONVERTER

FIELD OF THE INVENTION

The present invention relates generally to analog-to-digital converters, and specifically to analog-to-digital converters having folded differential logic encoding architectures.

BACKGROUND OF THE INVENTION

As speeds of operation of electronic equipment increase, analog-to-digital converters (ADCs) need to operate at increasing rates in order not become a bottleneck in the operation of the equipment. A known architecture in the electronic art, which inherently comprises a fast system for analog-to-digital conversion, is "flash" architecture, wherein a number of comparators operate simultaneously and in parallel. The readout of a flash ADC is substantially a "one-step" process.

FIG. 1 is a schematic block diagram of an m-bit flash analog-to-digital converter (ADC) 10, as is known in the art. Flash ADC 10 comprises a series resistor ladder 12, having $2^m$ equal valued resistors coupled to a first reference voltage Vr1 and a second reference voltage Vr2, which generate $2^m$ sequential potentials. The potentials are respectively applied to a first input of $2^m$ comparators 14, which have a voltage Vin to be digitized applied to a second input of the comparators. The output of the comparators is in the form of thermometer code, which is converted to binary code by a decoder 16. Decoder 16 typically uses conversion from thermometer code to Gray code as an intermediate step, in order to reduce the effects of sparkles and meta-stability in the thermometer code. ADC 10 is typically implemented as a very large scale integrated circuit (VLSI).

ADCs of the form of ADC 10 have the advantage of one-step digitization, but typically suffer from disadvantages including large input capacitance to the comparators, especially as the number of bits, m, of the ADC increases. Furthermore, as speeds of operation of ADCs increase, the effects of the input capacitance are exacerbated. A number of methods are known in the art for improving the performance of ADCs such as ADC 10, two of these methods being described hereinbelow. A first method is to use a folding architecture after the comparators.

FIG. 2 is a schematic electronic diagram of a 3-bit ADC 20 using a folding architecture analog-to-digital encoder (ADE), and giving a Gray code output, as is known in the art. Differential outputs from differential preamplifiers 22A, 22B, ..., 22G are input to respective differential pairs of transistors 24A, 24B, 24G. Each differential pair of transistors is driven by a current source delivering a current I0. A preamplifier and its coupled differential transistor pair acts substantially as a comparator. As shown in the diagram, the outputs of groups of the differential pairs are added, and the summed outputs generate respective potentials across resistors 25A, 25B, ..., 25F. The outputs of the differential pairs are connected to comparators 26, 28, and 30, so as to generate Gray code outputs D0, D1, and D2 respectively. Comparator 26, generating the least significant bit (LSB), receives its potential inputs from current source 32 and differential pairs 24A, 24C, 24E, and 24G feeding through resistors 25E and 25F. Since four differential pairs are summed, comparator 26 has a folding factor of 4. Comparator 28 receives its potential inputs from current source 34 and differential pairs 24B and 24F feeding through resistors 25C and 25D. Since two differential pairs are summed, comparator 28 has a folding factor of 2.

The Gray code output for a folded differential logic (FDL) ADE of the form of FIG. 2 is described by the following general equation:

$$G_i = \sum_{k=0}^{k=2^{n-(i+1)}-1} \frac{(1+(-1)^k)}{2} \oplus T_{k2^{i+1}+2^i} + Bias > \quad (1)$$

$$\sum_{k=0}^{k=2^{n-(i+1)}-1} \frac{(1+(-1)^{k+1})}{2} \oplus \bar{T}_{k2^{i+1}+2^i}$$

wherein Tj is the jth bit of the thermometer code, and Bias=1 for all j except the most significant bit, when Bias=0. In equation (1) the two expressions on either side of the inequality are evaluated first, and $G_i$ is set according to which side of the inequality is larger. The "Bias" term is needed in order that the encoder corresponding to the equation functions correctly.

Applying equation (1) to ADC 20, wherein n=3, gives:

$$G_0 = T_1 + \bar{T}_3 + T_5 + \bar{T}_7 + 1 > \bar{T}_1 + T_3 + \bar{T}_5 + T_7;$$
$$G_1 = T_2 + \bar{T}_6 + 1 > \bar{T}_2 + T_6; \text{ and} \quad (2)$$
$$G_2 = T_4 > \bar{T}_4$$

FIG. 3 is a schematic electronic diagram of an ADE section 40 of a 5-bit ADC giving a Gray code output, as is known in the art. Section 40 is implemented in a generally similar manner to those elements of ADC 20 which generate the LSB. ADE section 40 has a folding architecture comprising 16 comparators 42, each generally similar to the comparators described with reference to FIG. 2 formed by coupling a differential preamplifier to a differential transistor pair. (Only odd-numbered comparators are shown since these are the only comparators involved in generating the LSB.) Outputs from comparators 42 feed one comparator 44. Equation (1) for output G0 of comparator 44, wherein n=5, becomes:

$$G_0 = T_1 + \bar{T}_3 + \ldots + T_{29} + \bar{T}_{31} + 1 > \bar{T}_1 + T_3 + \ldots + \bar{T}_{29} + T_{31} \quad (3)$$

FIG. 4 illustrates a section 50 of a flash ADC, as is known in the art. Comparators 54 and 56 are coupled at their inputs to resistors 58 and 60 comprised in an input series resistor ladder. Outputs of comparators 54 and 56 are coupled to series resistor chains 51 and 53. While comparators 54 and 56 are theoretically step-function elements generating either a "1" or a "0" depending on the difference at their input, in practice each comparator acts as an amplifier having an output between 1 and 0. The outputs of resistor chains 51 and 53 similarly vary in a generally linear manner between 0 and 1. The outputs from resistor chains 51 and 53 act as interpolated outputs of comparators 54 and 56, and these outputs are applied to comparators 55. The outputs of comparators 55, which may be the final outputs of the ADC or which may processed further, thus effectively interpolate between the outputs of comparators 14, so increasing the resolution of the ADC. The circuit of FIG. 4 shows an interpolation depth of 4. Combinations of folding architectures, as described with reference to FIGS. 2 and 3, and interpolation techniques, as described with reference to FIG. 4, are known in the art.

U.S. Pat. No. 6,014,098, to Bult et al., whose disclosure is incorporated herein by reference, describes an ADC using a preamplifier before each initial comparator. Outputs of the comparators are fed through cascaded stages of averaging amplifiers. The stages comprise folding, so that the cascading effectively implements multiple folding.

An article titled "A 10-b 300 MHz Interpolated-Parallel A/D Converter," by Kimura et al., in *IEEE Journal of Solid-State Circuits* 28 (1993), which is incorporated herein by reference, describes an ADC using folded differential logic circuitry after interpolation resistors.

An article titled "A 10-b 50 MS/s 500 mW A/D Converter Using a Differential-Voltage Subconverter," by Miki et al., in *IEEE Journal of Solid-State Circuits* 29 (1994), which is incorporated herein by reference, a describes an ADC using a differential two-step architecture. An input voltage is coarsely digitized in a first step to generate higher significant bits. In a second step the coarse digital signal is converted to an analog value, using a digital-analog converter, and this is subtracted from the initial input voltage. The result of the subtraction is further digitized to provide the lower significant bits. The article also describes how folding the input series ladder facilitates differential operation.

An article titled "Error Suppressing Encode Logic of FCDL in a 6-b Flash A/D Converter," by Ono et al., in *IEEE Journal of Solid-State Circuits* 32 (1997), which is incorporated herein by reference, uses cascode circuitry at the output of initial comparators. The initial comparators are arranged in an FDL circuit, and the output of the comparators are input to the emitters of a pair of transistors in a cascode arrangement. The collectors of the transistors are input to a comparator, which, because of the intermediate cascoded transistors, is not affected by capacitance on the initial comparator output lines.

While the folding architecture exemplified by the circuits of FIG. 2 and FIG. 3 is a relatively simple system which is inherently fast, capacitance effects, especially for ADCs having larger numbers of bits, are still significant. The capacitance effects are more pronounced on long input lines such as the input lines to comparator 44 (FIG. 3). As rates of sampling for ADCs increase, the importance of minimizing line capacitance increases, since the capacitance effects increase time constants of the circuit. Furthermore, long folded architectures require correspondingly large bandwidths because of the increased number of "folds" in the signal.

SUMMARY OF THE INVENTION

In preferred embodiments of the present invention, a flash analog-to-digital converter (ADC) comprises a series resistor ladder. A reference voltage is applied to the ladder so as to generate sequential potentials, which together with an input analog voltage are fed to a plurality of folded differential logic (FDL) analog-to-digital encoders (ADEs). Each FDL-ADE is coupled to a respective section of the ladder, and generates a respective output responsive to the analog voltage input to the converter. The plurality of outputs of the FDL-ADEs are used as inputs to a resultant FDL encoder, which in turn generates a digital output corresponding to the input analog voltage.

The pyramidal structure of the present ADC, wherein the outputs of the first plurality of FDL-ADEs are coupled to the resultant FDL encoder, leads to lines of the total system within the ADC being substantially shorter than lines of an equivalent non-pyramidal ADC. Thus line capacitances are correspondingly reduced, and the bandwidth of the ADC is effectively increased. Also, by effectively breaking up one FDL-ADE into a plurality of shorter FDL-ADEs, bandwidth demands are reduced.

Each of the plurality of FDL-ADEs generates a respective binary partial sum of a specific bit. The bit, for example a least significant bit (LSB), corresponds to one of the bits of a digitized value of an analog input. The partial sums are in turn effectively summed by the resultant FDL encoder to generate a final binary output of the specific bit corresponding to the analog input. Preferably, all bits of the ADC are generated by a substantially similar process, so that each bit is formed by a plurality of FDL-ADEs generating partial sums which are effectively summed by a respective resultant FDL encoder.

In some preferred embodiments of the present invention, the ADC comprises three or more levels of encoders in a pyramid arrangement. A lowest level of ADEs generates first partial sums, which are summed in a smaller next level of encoders to form a second (smaller) plurality of partial sums. The second plurality of partial sums are also summed, and the process of summing reducing numbers of partial sums continues until one value, corresponding to the final binary output, is generated.

There is therefore provided, according to a preferred embodiment of the present invention, an analog-to-digital converter (ADC), including:

a plurality of first-level folded-differential-logic-encoders (FDLEs), coupled to receive an analog input signal and respective reference voltages and to provide respective outputs responsive to comparing a magnitude of the input signal to the respective reference voltages; and a second-level resultant FDLE, which is coupled to receive and combine the outputs of the first-level FDLEs to provide a digital value indicative of the magnitude of the input signal.

Preferably, each of the first-level FDLEs includes one or more differential preamplifiers coupled to respective transistor differential pairs, and each of the transistor differential pairs includes a respective current source driving the pair.

Preferably, each of the first-level FDLEs includes a comparator, and the outputs of the first-level FDLEs include differential outputs generated by the comparator responsive to inputs from the transistor differential pairs.

Further preferably, an input of the comparator is coupled to a bias current source, wherein the current source supplies a current having a value responsive to a constant term in a predetermined inequality defining an output of the comparator.

Preferably, the second-level resultant FDLE includes:

one or more transistor differential pairs, each pair including a respective current source driving the pair and generating an intermediate output; and a comparator, which receives the intermediate outputs from the one or more transistor differential pairs and outputs the digital value responsive thereto.

Further preferably, an input of the comparator is coupled to a bias current source, wherein the current source supplies a current having a value responsive to a constant term in a predetermined inequality defining the digital value.

Preferably, the digital value includes one or more pairs of differential values.

Preferably, at least a part of the ADC is implemented using a bipolar technology.

Alternatively or additionally, at least a part of the ADC is implemented using a complementary metal oxide semiconductor (CMOS) technology.

There is further provided, according to a preferred embodiment of the present invention, an analog-to-digital converter (ADC), including:

a first plurality of first-level folded-differential-logic-encoders (FDLEs), coupled to receive an analog input signal and respective reference voltages and to provide respective first outputs responsive to comparing a magnitude of the input signal to the respective reference voltages; and a second plurality of second-level FDLEs, which are coupled to receive and combine the outputs of the first-level FDLEs to provide a second plurality of intermediate outputs indicative of the magnitude of the input signal, wherein the second plurality is smaller than the first plurality; and a third-level resultant FDLE, which is coupled to receive and combine the second plurality of intermediate outputs to provide a digital value indicative of the magnitude of the input signal.

There is further provided, according to a preferred embodiment of the present invention, a method for determining a digital value of an analog signal, including:

encoding the analog signal in a plurality of first-level folded-differential-logic-encoders (FDLEs) coupled to receive respective reference voltages, so as to provide respective outputs responsive to comparing a magnitude of the analog signal to the respective reference voltages;

receiving the outputs of the first-level FDLEs in a second-level resultant FDLE; and generating in the second-level resultant FDLE the digital value responsive to the outputs of the first-level FDLEs.

Preferably, each of the first-level FDLEs includes one or more differential preamplifiers coupled to respective transistor differential pairs, and encoding the analog signal includes driving each of the transistor differential pairs with a respective current source.

Preferably, each of the first-level FDLEs includes a comparator, and encoding the analog signal includes generating differential outputs from the comparator responsive to inputs from the transistor differential Preferably, the method includes:

coupling an input of the comparator to a bias current source; and supplying a current having a value responsive to a constant term in a predetermined inequality defining an output of the comparator from the current source.

Preferably, the second-level resultant FDLE includes a comparator and one or more transistor differential pairs, each pair including a respective current source, and generating in the second-level resultant FDLE includes:

driving each of the pairs by its respective current source;

is generating an intermediate output from each of the pairs;

receiving the intermediate output from each of the pairs in the comparator; and outputting the digital value responsive to the received intermediate output.

Further preferably, generating in the second-level resultant FDLE includes:

coupling an input of the comparator to a bias current source; and supplying a current from the current source, the current having a value responsive to a constant term in a predetermined inequality defining the digital value.

Preferably, the digital value includes one or more pairs of differential values.

There is further provided, according to a preferred embodiment of the present invention, a method for determining a digital value of an analog signal, including:

encoding the analog signal in a first plurality of first-level folded-differential-logic-encoders (FDLEs) coupled to receive respective reference voltages, so as to provide respective first outputs responsive to comparing a magnitude of the analog signal to the respective reference voltages;

receiving the first outputs of the first-level FDLEs in a second plurality of second-level FDLEs, wherein the second plurality is smaller than the first plurality;

generating in the second-level FDLEs a second plurality of intermediate outputs indicative of the magnitude of the analog signal;

receiving the intermediate outputs of the second-level FDLEs in a third-level resultant FDLE; and generating in the third-level resultant FDLE the digital value responsive to the intermediate outputs of the second-level FDLEs.

There is further provided, according to a preferred embodiment of the present invention, an analog-to-digital converter (ADC), including:

a first plurality of differential preamplifiers, coupled to receive an analog input signal and respective reference voltages and to provide respective first outputs responsive to comparing a magnitude of the input signal to the respective reference voltages;

a second plurality of interpolation resistor ladders, coupled to receive the respective first outputs and to provide respective interpolated outputs responsive thereto;

a second plurality of first-level folded-differential-logic-encoders (FDLEs), coupled to receive the respective interpolated outputs and to provide respective second outputs responsive to comparing magnitudes of the respective interpolated outputs; and a second-level FDLE, which is coupled to receive and combine the second outputs of the first-level FDLEs to provide a digital value indicative of the magnitude of the input signal.

There is further provided, according to a preferred embodiment of the present invention, a method for determining a digital value of an analog signal, including:

inputting to a first plurality of differential preamplifiers the analog signal and respective reference voltages;

generating in the first plurality of differential preamplifiers a first plurality of first outputs responsive to the analog signal and the respective reference voltages;

interpolating the first outputs in a second plurality of interpolation resistor ladders coupled to the first plurality of differential preamplifiers so as to generate respective interpolated outputs responsive to the first outputs;

encoding the interpolated outputs in a second plurality of first-level folded-differential-logic-encoders (FDLEs) coupled to receive the respective interpolated outputs and to provide respective second outputs responsive to magnitudes of the interpolated outputs;

receiving the second outputs of the first-level FDLEs in a second-level resultant FDLE; and generating in the second-level resultant FDLE the digital value responsive to the second outputs of the first-level FDLEs.

The present invention will be more fully understood from the following detailed description of the preferred embodiments thereof, taken together with the drawings, in which:

DETAILED DESCRIPTION OF PREFERRED EMBODIMENTS

Figure 5:
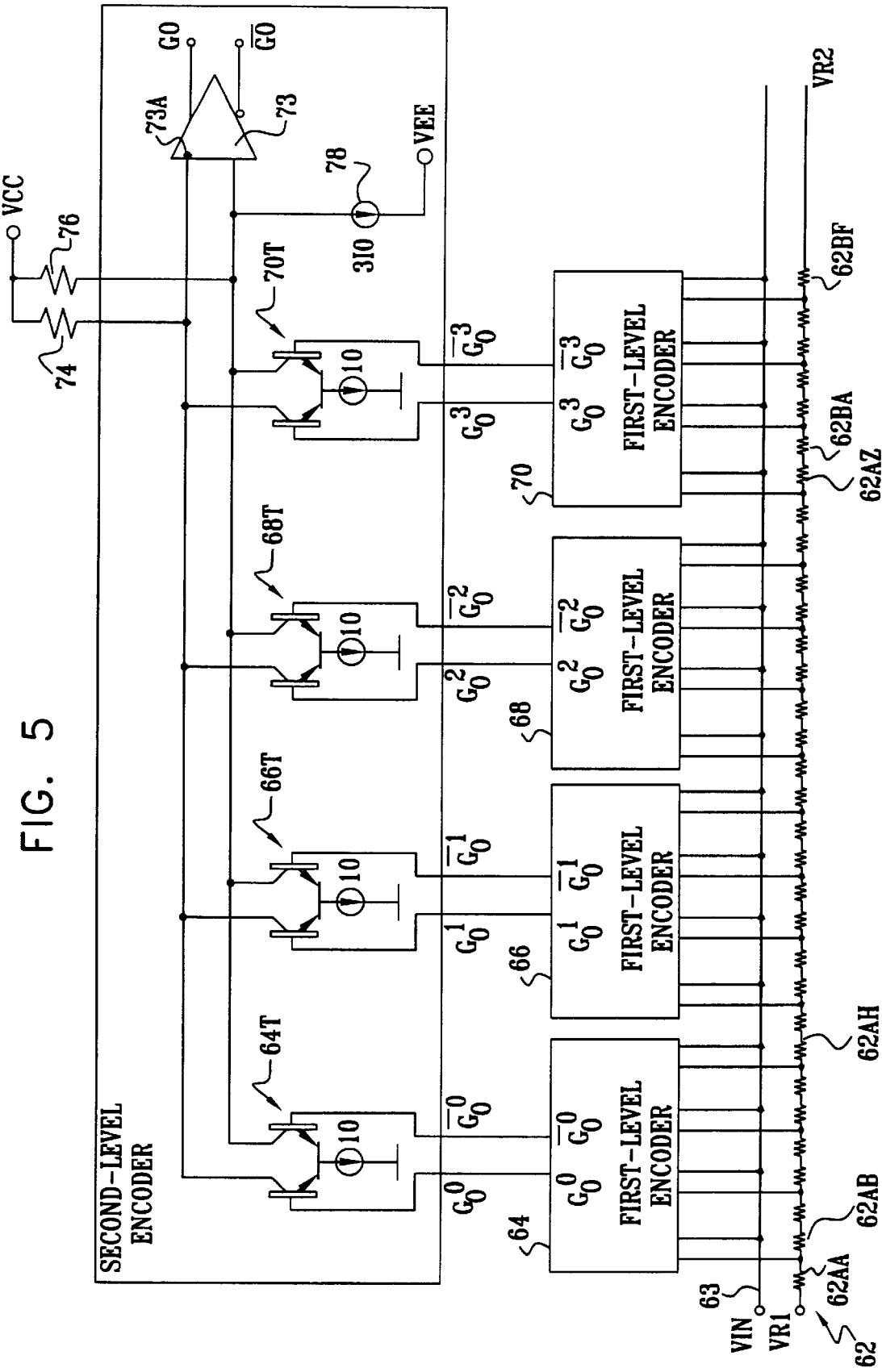
FIG. 5 is a schematic block diagram of a section of a 5-bit ADC, according to a preferred embodiment of the present invention.

Reference is now made to FIG. 5, which is a schematic block diagram of a section 60 of a 5-bit analog-to-digital converter (ADC), according to a preferred embodiment of the present invention. Section 60 comprises elements which are used to generate a least significant bit (LSB) of an analog input voltage Vin. Other sections of the ADC, not shown for clarity, implemented substantially as section 60, generate other bits of the input voltage. Elements of section 60 receive their inputs from a series resistor ladder 62 having 32 substantially equal resistors 62AA, 62AB, ..., 62AY, 62AZ, 62BA, 62BB, ..., 62BF, and from a line 63 carrying Vin. Section 60 is divided into four substantially similar first-level analog-to-digital encoders (ADEs), 64, 66, 68, and 70, each of which receives four inputs generated by eight resistors of ladder 62.

As described in more detail hereinbelow with respect to FIG. 6, each first-level ADE acts as a partial data encoder, providing first partial sums. Each first-level ADE 64, 66, 68, and 70 generates a respective partial sum $G_0^0$, $G_0^1$, $G_0^2$, and $G_0^3$ together with an inverse of the partial sum $\overline{G_0^0}$, $\overline{G_0^1}$, $\overline{G_0^2}$, and $\overline{G_0^3}$. Outputs of the first-level ADEs are further coupled to a second-level ADE 72 which provides a final output of section 60. Most preferably, section 60 is implemented as part of a very large scale integrated circuit (VLSI), using bipolar and/or complementary metal oxide semiconductor (CMOS) technologies. Alternatively or additionally, section 60 is implemented as a custom or semi-custom device, or as a combination of custom and semi-custom devices, optionally with discrete components.

Figure 6:
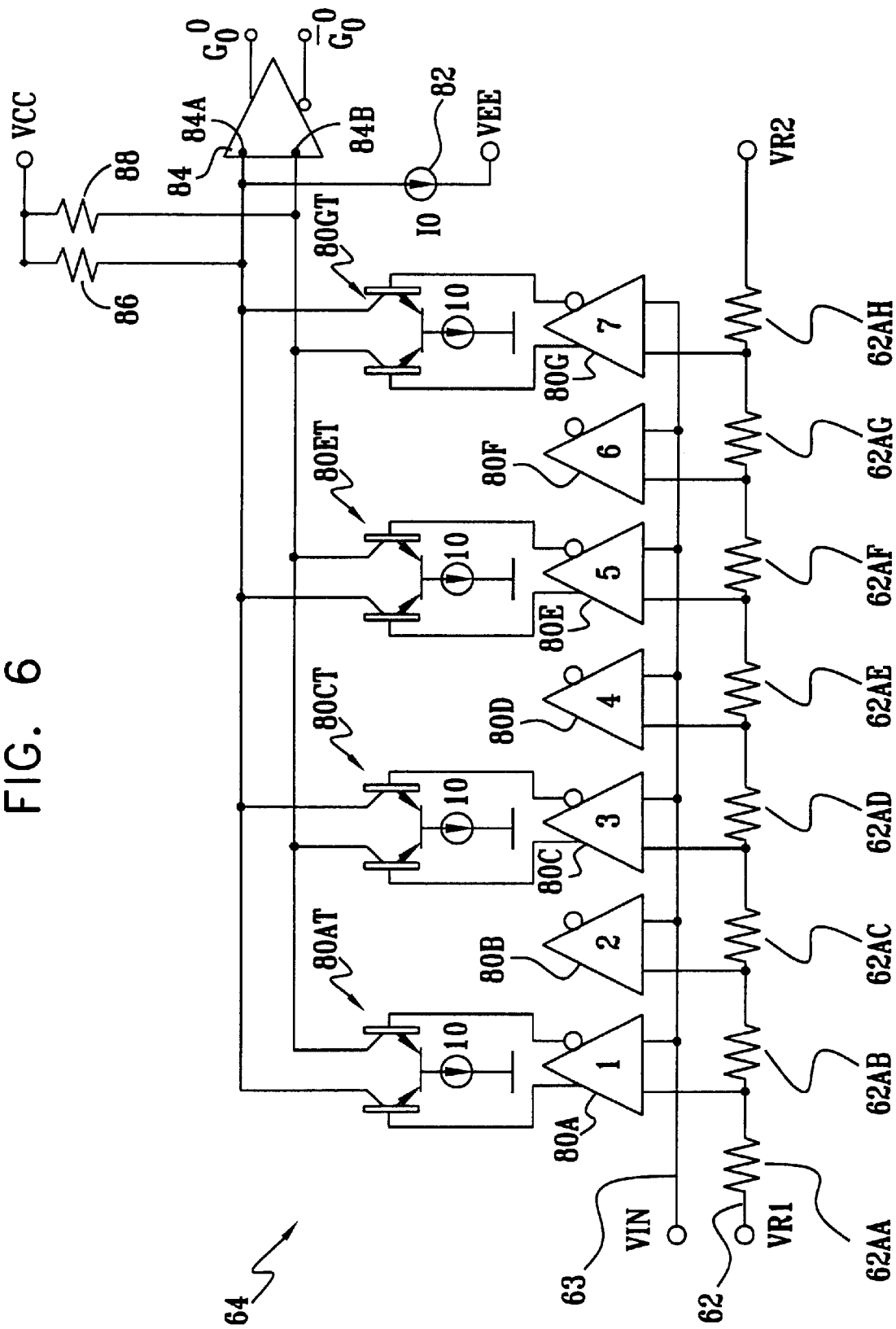
FIG. 6 is a schematic electronic diagram showing elements of a first level ADE of the ADC of FIG. 5, according to a preferred embodiment of the present invention.

FIG. 6 is a schematic electronic diagram showing elements of first level ADE 64, according to a preferred embodiment of the present invention. Partial sums $G_0^0$, $G_0^1$, $G_0^2$, and $G_0^3$, are defined as follows:

$$G_0^0 = T_1 + \overline{T_3} + T_5 + \overline{T_7} + 1 > \overline{T_1} + T_3 + \overline{T_5} + T_7 \tag{4a}$$

$$G_0^1 = T_9 + \overline{T_{11}} + T_{13} + \overline{T_{15}} + 1 > \overline{T_9} + T_{11} + \overline{T_{13}} + T_{15} \tag{4b}$$

$$G_0^2 = T_{17} + \overline{T_{19}} + T_{21} + \overline{T_{23}} + 1 > \overline{T_{17}} + T_{19} + \overline{T_{21}} + T_{23} \tag{4c}$$

$$G_0^3 = T_{25} + \overline{T_{27}} + T_{29} + \overline{T_{31}} + 1 > \overline{T_{25}} + T_{27} + \overline{T_{29}} + T_{31} \tag{4d}$$

Implementation of equation (4a) by first level ADE 64 is described herein. The partial sums exemplified by equations (4b), (4c), and (4d) are implemented, mutatis mutandis, substantially as described for equation (4a) in respective ADEs 66, 68, and 70. ADE 64 receives input voltages generated by eight resistors 62AA, 62AB, 62AC, 62AD, 62AE, 62AF, 62AG, and 62AH of ladder 62. The resistors are coupled to inputs of seven substantially similar differential preamplifiers 80A, 80B, ..., 80G. Each differential preamplifier also receives from line 63 an input voltage Vin to be digitized. Differential preamplifiers 80A, 80B, ..., 80G each provide differential outputs, but only preamplifiers 80A, 80C, 80E, and 80G contribute towards the implementation of the LSB partial sum represented by equation (4a). (Preamplifiers 80B, 80D, and 80F contribute to other partial sums of other bits of the ADC.) Preamplifiers 80A, 80C, 80E, and 80G are in turn coupled to four differential pairs of transistors 80AT, 80CT, 80ET, and 80GT. Each differential pair is driven by respective substantially similar current sources providing a current I0. It will be understood that each preamplifier-differential-pair set acts substantially as a comparator, so that ADE 64 effectively comprises four comparators.

The outputs of differential pairs 80AT, 80CT, 80ET, and 80GT are coupled together in a folded differential logic (FDL) architecture so as to emulate terms in equation (4a), and the "1" term in equation (4a) is emulated by a "bias" current source 82. Thus an input 84A of a comparator 84 corresponds to the left side of the inequality of equation (4a), since the currents summed at this input generate a corresponding potential across a resistor 86. Similarly, an input 84B of comparator 84 corresponds to the right side of the inequality, since the currents summed at this input generate a corresponding potential across a resistor 88.

Figure 1:
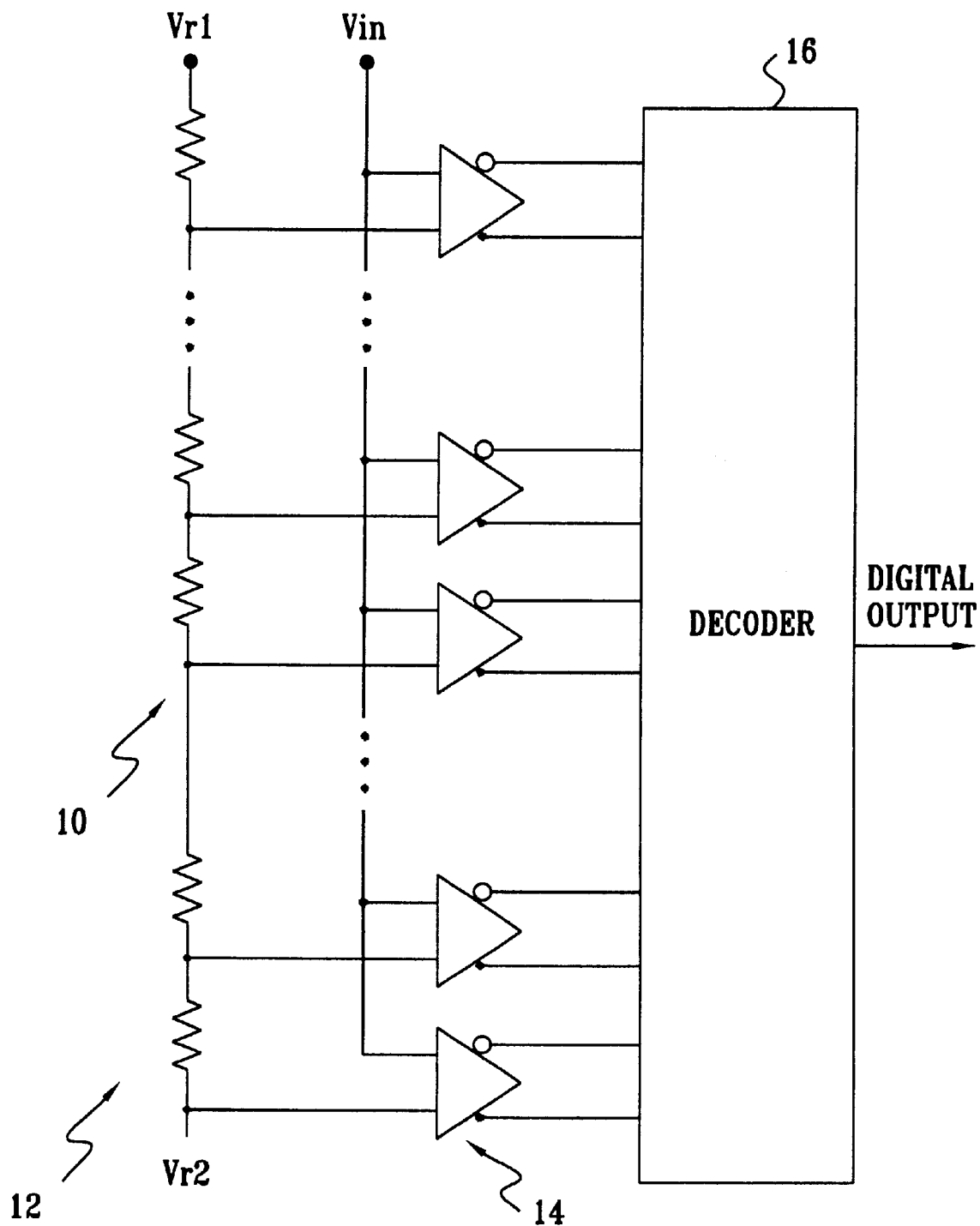
FIG. 1 is a schematic block diagram of an m-bit flash analog-to-digital converter (ADC), as is known in the art.
Figure 2:
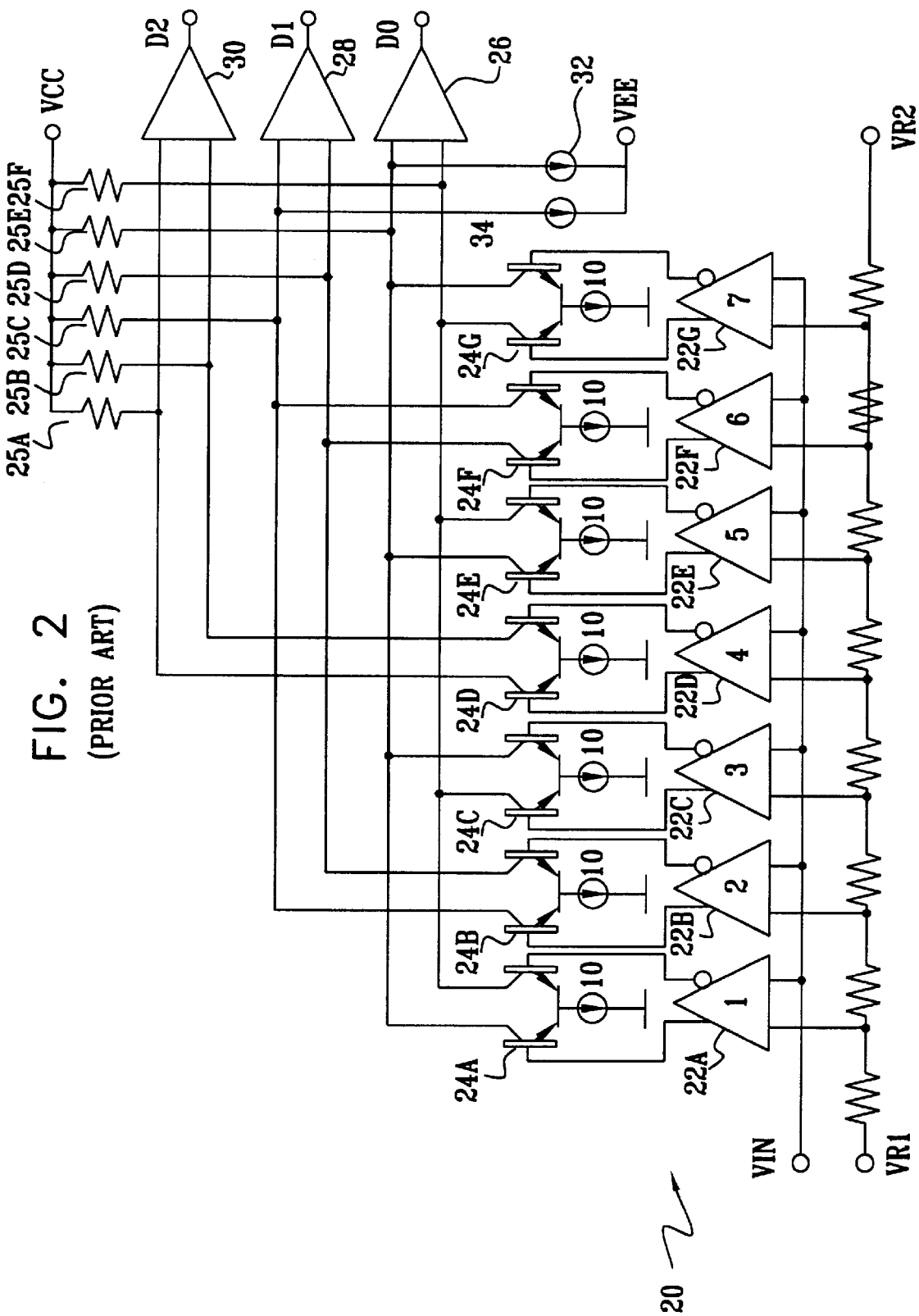
FIG. 2 is a schematic electronic diagram of a 3-bit ADC using a folding architecture analog-to-digital encoder (ADE), and giving a Gray code output, as is known in the art.
Figure 3:
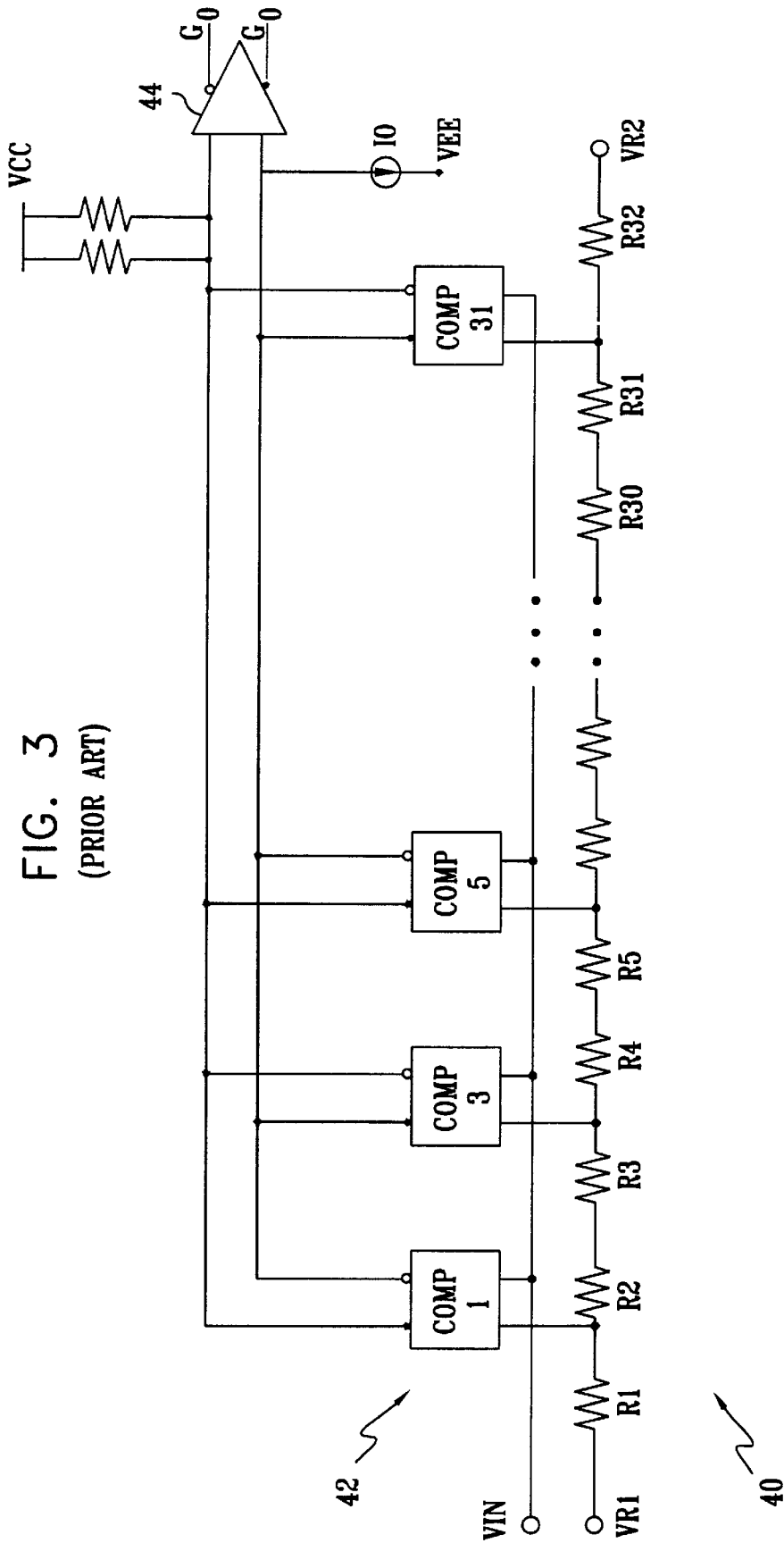
FIG. 3 is a schematic electronic diagram of an ADE section of a 5-bit ADC giving a Gray code output, as is known in the art.

As described above with reference to FIG. 3, the LSB of the folded differential logic 5-bit ADC known in the art using is defined according to the equation:

$$G_0 = T_1 + \overline{T_3} + \ldots + T_{29} + \overline{T_{31}} + 1 > \overline{T_1} + T_3 + \ldots \overline{T_{29}} + T_{31} \tag{3}$$

In preferred embodiments of the present invention, for an LSB of 5-bit ADC 51, G0 is defined in terms of four partial sums $G_0^0$, $G_0^1$, $G_0^2$, and $G_0^3$:

$$G_0 = G_0^0 + G_0^1 + G_0^2 + G_0^3 > \overline{G_0^0} + \overline{G_0^1} + \overline{G_0^2} + \overline{G_0^3} + 3 \tag{5}$$

By substituting equations (4a), (4b), (4c), and (4d) into (5), it will be appreciated that equation (5) is generally equivalent to equation (3); specifically, for thermometer code the equivalence holds.

Returning to FIG. 5, equation (5) is implemented by second-level ADE 72. ADE 72 comprises four differential pairs of transistors 64T, 66T, 68T, and 70T, each driven by respective substantially similar current sources I0. The differential pairs receive respective inputs from ADEs 64, 66, 68, and 70. Outputs of the transistor pairs are coupled in an FDL arrangement to a comparator 73. A voltage developed across a resistor 74, corresponding to the left side of the inequality in equation (5), is coupled to an input 73A of comparator 73. Resistor 74 receives outputs from the transistor pairs corresponding to outputs $G_0^0$, $G_0^1$, $G_0^2$, and $G_0^3$.

A resistor 76 receives transistor pair outputs corresponding to outputs $\overline{0^0}$, $\overline{G_0{}^1}$, $\overline{G_0{}^2}$, and $\overline{G_0{}^3}$. Resistor 76 also receives a bias current 3I0 from a current source 78, corresponding to the term 3 on the right side of the inequality. A voltage developed across resistor 76, responsive to the currents received, is coupled to an input 73B of comparator 73. Thus, the outputs of comparator 73 correspond to the least significant bit and its inverse for the 5-bit ADC.

Equations (5), partial sums (4a), (4b), (4c), and (4d), and equation (3) are particular examples of more general equivalences, as described below.

Equation (1) may be rewritten as:

$$\text{Bit}_i = \text{Sum}_i + \text{Bias}_i > \overline{\text{Sum}_i} \tag{6}$$

Equations (1) and (6) are general equations, a particular example of which is equation (3). Each side of the inequality in equation (6) may be sub-divided into k partial sums:

$$\text{Bit}_i = \text{Sum}_i{}^1 + \text{Sum}_i{}^2 + \ldots + \text{Sum}_i{}^k + \text{Bias}_i > \overline{\text{Sum}_i{}^1} + \overline{\text{Sum}_i{}^2} \ldots + \overline{\text{Sum}_i{}^k} \tag{7}$$

Each of the partial sums may be written:

$$\text{Bit}_i{}^j = \text{Sum}_i{}^j + \text{Bias}_i{}^j > \overline{\text{Sum}_i{}^j} \tag{8}$$

wherein j=1, . . . , k.

As for equation (1) the $\text{Bias}_i{}^j$ terms are required, depending on "i," so that a comparator corresponding to the inequality functions correctly.

Equation (8) is a general equation for a first level of folded differential logic, corresponding to partial sums (4a), (4b), (4c), and (4d), and respective ADE sections 64, 66, 68, and 70.

A second level general equation is given by $$\text{Bit}_i = \text{Bit}_i{}^1 + \text{Bit}_i{}^2 + \ldots + \text{Bit}_i{}^k > \overline{\text{Bit}_i{}^1} + \overline{\text{Bit}_i{}^2} + \ldots + \overline{\text{Bit}_i{}^k} + \text{Bias}_i{}^1 + \text{Bias}_i{}^2 + \ldots + \text{Bias}_i{}^k - \text{Bias}_i \tag{9}$$

It will be noted that if the expressions for $\text{Bias}_{ij}$ are substituted from equation (8) into the left side of the inequality of equation (9), equation (7) is recovered as the left side of the inequality. The equivalence between equation (9) and equation (7) holds for thermometer code, and it will be observed that equation (5) is a particular case of equation (9). Equation (5) comprises four partial sum results, so that the bias terms for the LSB (i=0) correspond to $\text{Bias}_0{}^1 + \text{Bias}_0{}^2 + \text{Bias}_0{}^3 + \text{Bias}_0{}^4 - \text{Bias}_0$, corresponding with the value of 3I0 set for the current in current source 78.

While the preferred embodiment described hereinabove with reference to FIG. 5 is implemented to derive values for an LSB, it will be appreciated that the scope of the present invention also applies to the generation of more significant bits. Those skilled in the art will be able to apply the principles described hereinabove for the generation of such bits. It will also be appreciated that the two-level system exemplified by the preferred embodiment described with reference to FIG. 5 may be extended to systems comprising more than two levels.

Figure 7A:
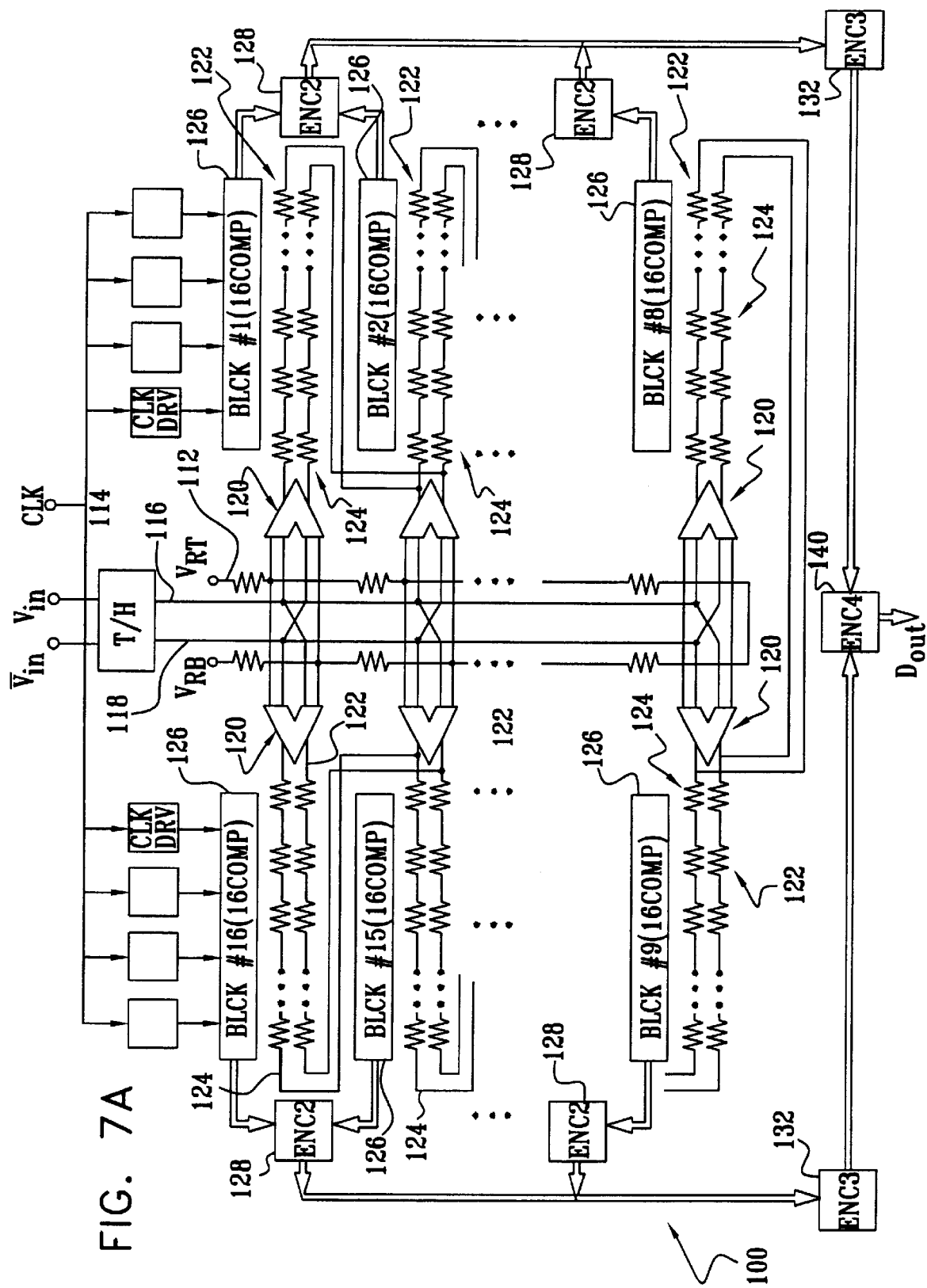
FIG. 7A is a schematic block diagram of a multi-level ADC, according to a preferred embodiment of the present invention.
Figure 7B:
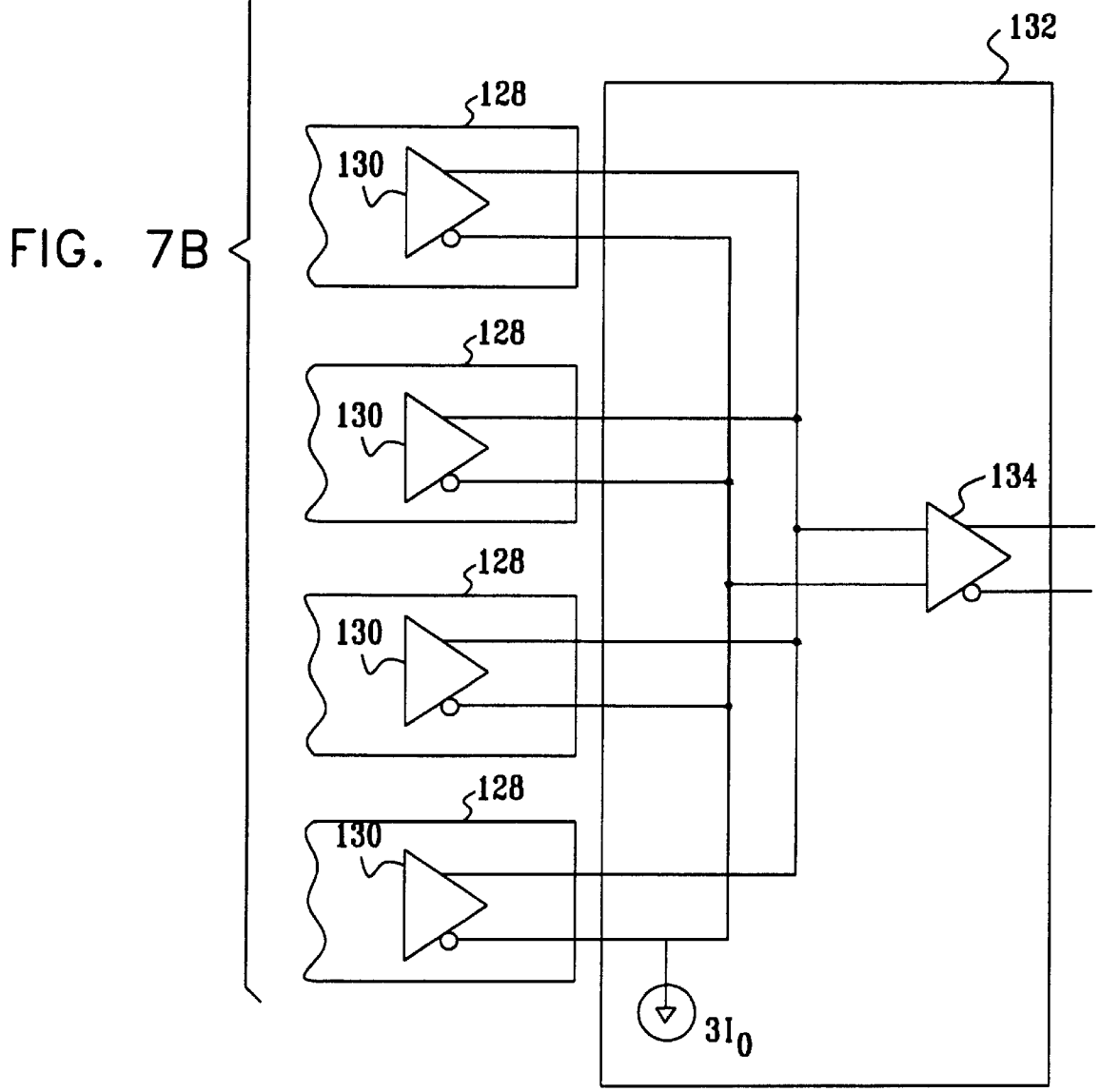
FIG. 7B is a schematic block diagram showing elements of the ADC of FIG. 7A in more detail, according to a preferred embodiment of the present invention.

FIG. 7A is a schematic block diagram of a multi-level ADC 100, according to a preferred embodiment of the present invention. FIG. 7B is a schematic block diagram showing elements of ADC 100 in more detail. ADC 100 comprises a series resistor ladder 112 comprising 16 substantially equal-valued resistors. Ladder 112 is driven by reference potentials VRT and VRB. ADC 100 receives a potential Vin, and an inverse $\overline{\text{Vin}}$ into a track and hold amplifier 114. The values from amplifier 114 are output to respective lines 116 and 118.

ADC 100 comprises 16 fully differential substantially similar preamplifiers 120, which each receive inputs from Vin and $\overline{\text{Vin}}$ via lines 116 and 118. In addition, each preamplifier 120 receives two respective reference inputs from ladder 112, and outputs two corresponding fully differential outputs. Most preferably, ladder 112 is folded, in order to facilitate differential implementation of ADC 100.

Figure 4:
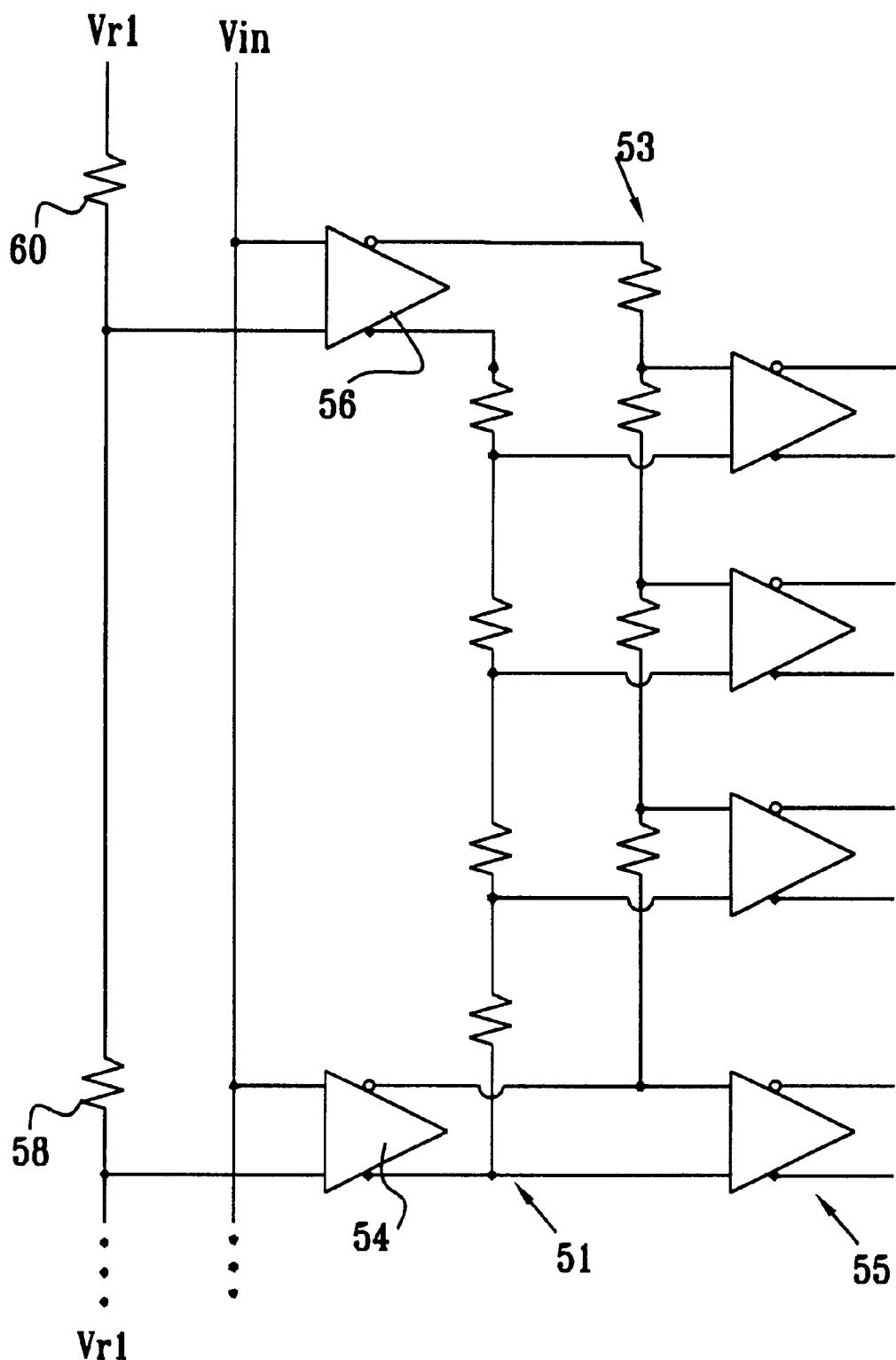
FIG. 4 illustrates a section of a flash ADC, as is known in the art.

The outputs of adjacent preamplifiers 120 are coupled together by interpolation resistor chains 122 and 124, substantially as described in the Background of the Invention with reference to FIG. 4. Each resistor chain 122 and 124 comprises 16 substantially equal resistors, the resistors generating outputs to comparators in 16 comparator blocks 126. Each comparator block 126 is generally similar to first level ADE 64, comprising 16 comparators instead of the 4 comparators of section 64.

The description hereinbelow applies generally for generation of an LSB, and, mutatis mutandis, for generation of higher bits, for ADC 100. Where necessary, "dummy" levels are preferably inserted in an encoder to reduce "hazards" of timing skew, as is known in the art. Each comparator block 126 acts effectively as a first-level encoder, supplying first-level partial sums to one of 8 second-level encoders 128 (FIG. 7B). Each second-level encoder 128 comprises a comparator 130 which receives two partial sums from two respective comparator blocks 126, and outputs a result. It will be understood that each second level 2-input encoder 128 is effectively an XOR gate, which may be implemented as described herein or by other methods known in the art.

Four outputs of a first set of second-level encoders 128 are each input to a first third-level encoder 132, and four outputs of a second set of second-tier encoders 128 are each input to a second third-level encoder 132. Each encoder 132 is substantially implemented as described above for ADE 72 (FIG. 5). Thus, encoder 132 comprises a comparator 134, which receives its four inputs from encoders 128. As for ADE 72, a bias for comparator 134 is set to have a value of 3I0.

In a fourth-level, an encoder 140 receives the outputs from the two encoders 132, and adds them. Encoder 140 is implemented in substantially the same manner as each encoder 128, most preferably as an emitter-collector logic (ECL) XOR gate.

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. An analog-to-digital converter (ADC), comprising:
    a plurality of first-level folded-differential-logic-encoders (FDLEs), coupled to receive an analog input signal and respective reference voltages and to provide respective outputs responsive to comparing a magnitude of the input signal to the respective reference voltages; and
    a second-level FDLE, which is coupled to receive and combine the outputs of the first-level FDLEs to provide a digital value indicative of the magnitude of the input signal.

2. An ADC according to claim 1, wherein each of the first-level FDLEs comprises one or more differential preamplifiers coupled to respective transistor differential pairs, and wherein each of the transistor differential pairs comprises a respective current source driving the pair.

3. An ADC according to claim 2, wherein each of the first-level FDLEs comprises a comparator, and wherein the outputs of the first-level FDLEs comprise differential outputs generated by the comparator responsive to inputs from the transistor differential pairs.

4. An ADC according to claim 3, wherein an input of the comparator is coupled to a bias current source, wherein the current source supplies a current having a value responsive to a constant term in a predetermined inequality defining an output of the comparator.

5. An ADC according to claim 1, wherein the second-level FDLE comprises:
   one or more transistor differential pairs, each pair comprising a respective current source driving the pair and generating an intermediate output; and
   a comparator, which receives the intermediate outputs from the one or more transistor differential pairs and outputs the digital value responsive thereto.

6. An ADC according to claim 5, wherein an input of the comparator is coupled to a bias current source, wherein the current source supplies a current having a value responsive to a constant term in a predetermined inequality defining the digital value.

7. An ADC according to claim 1, wherein the digital value comprises one or more pairs of differential values.

8. An ADC according to claim 1, wherein at least a part of the ADC is implemented using a bipolar technology.

9. An ADC according to claim 1, wherein at least a part of the ADC is implemented using a complementary metal oxide semiconductor (CMOS) technology.

10. An analog-to-digital converter (ADC), comprising:
    a first plurality of first-level folded-differential-logic-encoders (FDLEs), coupled to receive an analog input signal and respective reference voltages and to provide respective first outputs responsive to comparing a magnitude of the input signal to the respective reference voltages; and
    a second plurality of second-level FDLEs, which are coupled to receive and combine the outputs of the first-level FDLEs to provide a second plurality of intermediate outputs indicative of the magnitude of the input signal, wherein the second plurality is smaller than the first plurality; and
    a third-level FDLE, which is coupled to receive and combine the second plurality of intermediate outputs to provide a digital value indicative of the magnitude of the input signal.

11. A method for determining a digital value of an analog signal, comprising:
    encoding the analog signal in a plurality of first-level folded-differential-logic-encoders (FDLEs) coupled to receive respective reference voltages, so as to provide respective outputs responsive to comparing a magnitude of the analog signal to the respective reference voltages;
    receiving the outputs of the first-level FDLEs in a second-level FDLE; and
    generating in the second-level FDLE the digital value responsive to the outputs of the first-level FDLEs.

12. A method according to claim 11, wherein each of the first-level FDLEs comprises one or more differential preamplifiers coupled to respective transistor differential pairs, and wherein encoding the analog signal comprises driving each of the transistor differential pairs with a respective current source.

13. A method according to claim 12, wherein each of the first-level FDLEs comprises a comparator, and wherein encoding the analog signal comprises generating differential outputs from the comparator responsive to inputs from the transistor differential pairs.

14. A method according to claim 13, and comprising:
    coupling an input of the comparator to a bias current source; and
    supplying a current having a value responsive to a constant term in a predetermined inequality defining an output of the comparator from the current source.

15. A method according to claim 11, wherein the second-level FDLE comprises a comparator and one or more transistor differential pairs, each pair comprising a respective current source, and wherein generating in the second-level FDLE comprises:
    driving each of the pairs by its respective current source;
    generating an intermediate output from each of the pairs;
    receiving the intermediate output from each of the pairs in the comparator; and
    outputting the digital value responsive to the received intermediate output.

16. A method according to claim 15, wherein generating in the second-level FDLE comprises:
    coupling an input of the comparator to a bias current source; and
    supplying a current from the current source, the current having a value responsive to a constant term in a predetermined inequality defining the digital value.

17. A method according to claim 11, wherein the digital value comprises one or more pairs of differential values.

18. A method for determining a digital value of an analog signal, comprising:
    encoding the analog signal in a first plurality of first-level folded-differential-logic-encoders (FDLEs) coupled to receive respective reference voltages, so as to provide respective first outputs responsive to comparing a magnitude of the analog signal to the respective reference voltages;
    receiving the first outputs of the first-level FDLEs in a second plurality of second-level FDLEs, wherein the second plurality is smaller than the first plurality;
    generating in the second-level FDLEs a second plurality of intermediate outputs indicative of the magnitude of the analog signal;
    receiving the intermediate outputs of the second-level FDLEs in a third-level FDLE; and
    generating in the third-level FDLE the digital value responsive to the intermediate outputs of the second-level FDLEs.

19. An analog-to-digital converter (ADC), comprising:
    a first plurality of differential preamplifiers, coupled to receive an analog input signal and respective reference voltages and to provide respective first outputs responsive to comparing a magnitude of the input signal to the respective reference voltages;
    a second plurality of interpolation resistor ladders, coupled to receive the respective first outputs and to provide respective interpolated outputs responsive thereto;
    a second plurality of first-level folded-differential-logic-encoders (FDLEs), coupled to receive the respective interpolated outputs and to provide respective second outputs responsive to comparing magnitudes of the respective interpolated outputs; and a second-level FDLE, which is coupled to receive and combine the second outputs of the first-level FDLEs to provide a digital value indicative of the magnitude of the input signal.

20. A method for determining a digital value of an analog signal, comprising:

inputting to a first plurality of differential preamplifiers the analog signal and respective reference voltages;

generating in the first plurality of differential preamplifiers a first plurality of first outputs responsive to the analog signal and the respective reference voltages;

interpolating the first outputs in a second plurality of interpolation resistor ladders coupled to the first plurality of differential preamplifiers so as to generate respective interpolated outputs responsive to the first outputs;

encoding the interpolated outputs in a second plurality of first-level folded-differential-logic-encoders (FDLEs) coupled to receive the respective interpolated outputs and to provide respective second outputs responsive to magnitudes of the interpolated outputs;

receiving the second outputs of the first-level FDLEs in a second-level FDLE; and generating in the second-level FDLE the digital value responsive to the second outputs of the first-level FDLEs.

* * * * *